US010224435B2

(12) United States Patent
Kim et al.

(10) Patent No.: US 10,224,435 B2
(45) Date of Patent: Mar. 5, 2019

(54) TRANSISTOR, MANUFACTURING METHOD THEREOF, AND DISPLAY DEVICE INCLUDING THE SAME

(71) Applicant: Samsung Display Co., Ltd., Yongin-si, Gyeonggi-do (KR)

(72) Inventors: Jee Hoon Kim, Cheonan-si (KR); Shin Hyuk Yang, Seongnam-si (KR); Kwang Soo Lee, Gwangmyeong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/805,594

(22) Filed: Nov. 7, 2017

(65) Prior Publication Data

US 2018/0145185 A1    May 24, 2018

(30) Foreign Application Priority Data

Nov. 21, 2016    (KR) .......................... 10-2016-0155240

(51) Int. Cl.
| | |
|---|---|
| H01L 29/66 | (2006.01) |
| H01L 29/786 | (2006.01) |
| H01L 27/12 | (2006.01) |
| H01L 27/32 | (2006.01) |

(52) U.S. Cl.
CPC .... *H01L 29/78696* (2013.01); *H01L 27/1225* (2013.01); *H01L 29/66969* (2013.01); *H01L 29/7869* (2013.01); *H01L 29/78642* (2013.01); *H01L 27/3262* (2013.01)

(58) Field of Classification Search
CPC ........... H01L 27/1225; H01L 29/66969; H01L 29/78642; H01L 29/7869
USPC .......................... 257/60, 135, 220, 263, 328
See application file for complete search history.

(56) References Cited

U.S. PATENT DOCUMENTS

| | | | |
|---|---|---|---|
| 8,895,979 B2 | 11/2014 | Chang et al. | |
| 9,099,384 B2 * | 8/2015 | May ........................ | H01L 29/24 |

FOREIGN PATENT DOCUMENTS

| | | |
|---|---|---|
| KR | 10-0149571 B1 | 6/1998 |
| KR | 10-2005-0001936 A | 1/2005 |
| KR | 10-1243667 B1 | 3/2013 |
| KR | 10-2013-0074954 A | 7/2013 |
| KR | 10-1484966 B1 | 1/2015 |

\* cited by examiner

*Primary Examiner* — Tan N Tran
(74) *Attorney, Agent, or Firm* — Lewis Roca Rothgerber Christie LLP

(57) ABSTRACT

An exemplary embodiment of the present disclosure provides a transistor including: a drain electrode; a first insulating member on the drain electrode and having a tilted side wall; a source electrode on the first insulating member; an active member covering the tilted side wall of the first insulating member, a side wall of the source electrode, and a side wall of the drain electrode; a second insulating member covering the source electrode and the active member; and a gate electrode on the second insulating member and overlapping the active member, wherein the active member defines a first channel region adjacent to the drain electrode and a second channel region adjacent to the source electrode, and wherein a width of the first channel region may be greater than that of the second channel region.

13 Claims, 19 Drawing Sheets

TRANSISTOR, MANUFACTURING METHOD THEREOF, AND DISPLAY DEVICE INCLUDING THE SAME

CROSS-REFERENCE TO RELATED APPLICATION

This application claims priority to and the benefit of Korean Patent Application No. 10-2016-0155240 filed in the Korean Intellectual Property Office on Nov. 21, 2016, the entire contents of which are incorporated herein by reference.

BACKGROUND

1. Field

The present disclosure relates to a transistor, a manufacturing method thereof, and a display device including the same.

2. Description of the Related Art

Generally, a liquid crystal display (LCD), an organic light emitting diode (OLED) display, etc., are used as a display device.

The display device includes a plurality of transistors and capacitors. Each transistor includes a gate electrode, a source electrode, a drain electrode, and a semiconductor.

Because a channel formed in a semiconductor of the transistor is horizontally formed, and because the source electrode and the drain electrode are formed on the same layer, a spatial limitation is caused in forming them in the high-resolution display device.

In addition, because the channel of the transistor is horizontally formed, the channel may be easily damaged when a panel is bent.

The above information disclosed in this Background section is only for enhancement of understanding of the background of the invention and therefore it may contain information that does not form prior art.

SUMMARY

Embodiments of the present disclosure relate to a transistor, a manufacturing method thereof, and a transistor display panel including the same that may be applied to a high-resolution display device.

An exemplary embodiment of the present disclosure provides a transistor including: a drain electrode; a first insulating member on the drain electrode and having a tilted side wall; a source electrode on the first insulating member; an active member covering the tilted side wall of the first insulating member, a side wall of the source electrode, and a side wall of the drain electrode; a second insulating member covering the source electrode and the active member; and a gate electrode on the second insulating member and overlapping the active member, wherein the active member defines a first channel region adjacent to the drain electrode and a second channel region adjacent to the source electrode, and wherein a width of the first channel region may be greater than that of the second channel region.

The tilted side wall of the first insulating member may include a first side wall adjacent to the drain electrode and a second side wall adjacent to the source electrode, and a width of the first side wall may be greater than that of the second side wall.

All regions of the source electrode may overlap the drain electrode.

Some regions of the source electrode may overlap the drain electrode.

The drain electrode may have a first opening, and the source electrode may overlap the first opening.

The active member may include a first active member and a second active member that are separated from each other.

The gate electrode may have a second opening, and the source electrode may overlap the second opening.

The active member may include a third active member between the first active member and the second active member, and the gate electrode may overlap the third active member.

The gate electrode may overlap the source electrode.

The gate electrode may have a second opening, and the source electrode may overlap the second opening.

Another embodiment of the present disclosure provides a manufacturing method of a transistor, the method including: forming a drain electrode on a substrate; sequentially covering the drain electrode with a first insulating layer and a source electrode layer; concurrently patterning the first insulating layer and the source electrode layer to form a first insulating member and a source electrode each having a tilted side wall; covering the tilted side wall of the first insulating member, the tilted side wall of the source electrode, and a side wall of the drain electrode with an active member; covering the source electrode and the active member with a second insulating member; and forming a gate electrode overlapping the active member on the second insulating member, wherein the active member defines a first channel region adjacent to the drain electrode and a second channel region adjacent to the source electrode, and wherein a width of the first channel region is greater than that of the second channel region.

The forming of the first insulating member and the source electrode may include exposing at least a portion of an upper surface of the drain electrode.

Yet another embodiment of the present disclosure provides a display device including: a substrate; a transistor on the substrate; and a light emitting diode (LED) connected to the transistor, wherein the transistor includes: a drain electrode on the substrate; a first insulating member on the drain electrode and having a tilted side wall; a source electrode on the first insulating member; an active member covering the tilted side wall of the first insulating member, a side wall of the source electrode, and a side wall of the drain electrode; a second insulating member covering the source electrode and the active member; and a gate electrode on the second insulating member and overlapping the active member, wherein the tilted side wall of the first insulating member includes: a first side wall adjacent to the drain electrode; and a second side wall adjacent to the source electrode, and wherein a width of the first side wall is greater than that of the second side wall, and the light emitting diode (LED) includes: a first electrode connected to the transistor; an emission member on the first electrode; and a second electrode on the emission member.

According to embodiments of the present disclosure, it is possible to minimize or reduce a size of a transistor irrespective of a length of a channel, thereby reducing a space in which the transistor is located. Accordingly, it is possible to easily manufacture a high-resolution display device.

In addition, it is possible to prevent characteristics of the transistor from deteriorating due to a hot carrier effect, or to reduce the likelihood thereof.

Further, it is possible to reduce a space for forming a capacitor. Accordingly, it is possible to easily manufacture a high-resolution display device.

DETAILED DESCRIPTION

Figure 1:
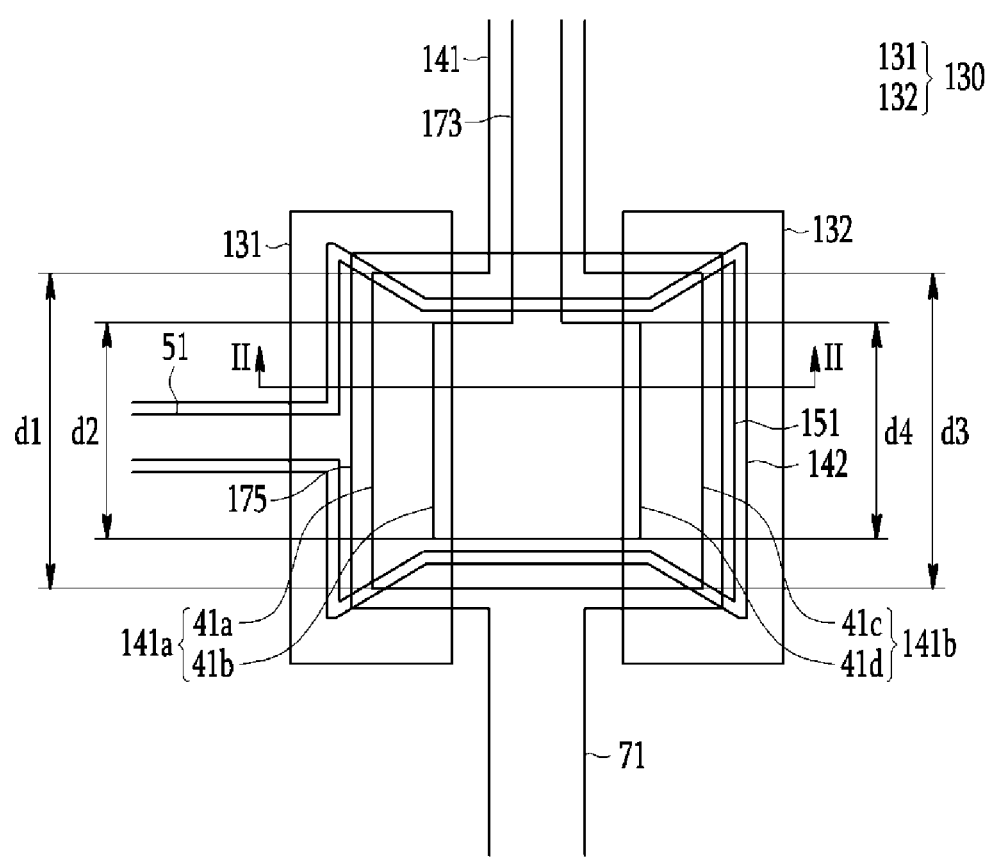
FIG. 1 illustrates a top plan view of a transistor according to an exemplary embodiment.

Embodiments of the present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

To clearly describe the present invention, portions which do not relate to the description are omitted, and, unless otherwise noted, like reference numerals designate like elements throughout the specification.

The size and thickness of each component shown in the drawings may be arbitrarily shown for better understanding and ease of description, but the present disclosure is not limited thereto.

It will be understood that, although the terms "first," "second," "third," etc., may be used herein to describe various elements, components, regions, layers, and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "lower," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "lower" relative to other elements or features would then be oriented as "upper" relative to the other elements or features. Thus, the example terms "lower" and "upper" can encompass both an orientation of lower and upper. The device may be otherwise oriented (e.g., rotated 90 degrees or at other orientations) and the spatially relative descriptors used herein should be interpreted accordingly.

It will be understood that when an element such as a layer, film, region, or substrate is referred to as being "on" or "connected to" another element, it can be directly on or directly connected to the other element or intervening elements may also be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the terms "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present invention refers to "one or more embodiments of the present invention." In addition, the use of alternative language, such as "or," when describing embodiments of the present invention, refers to "one or more embodiments of the present invention" for each corresponding item listed. As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Hereinafter, a transistor according to an exemplary embodiment is described with reference to FIG. 1 and FIG. 2.

Figure 2:
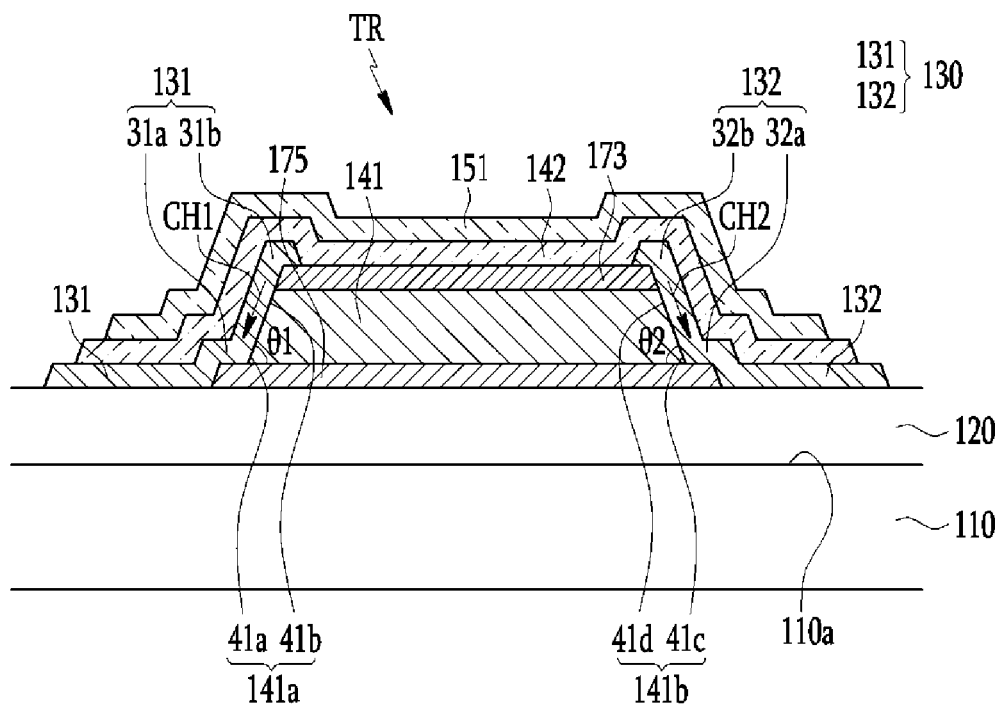
FIG. 2 illustrates a cross-sectional view of a transistor taken along the line II-II of FIG. 1.

FIG. 1 illustrates a top plan view of a transistor according to an exemplary embodiment, and FIG. 2 illustrates a cross-sectional view of a transistor taken along the line II-II of FIG. 1.

As shown in FIG. 1 and FIG. 2, a transistor according to an exemplary embodiment includes a substrate 110, a drain electrode 175, a first insulating member 141, a source electrode 173, an active member 130, a second insulating member 142, and a gate electrode 151 positioned on the substrate 110.

The substrate 110 may be an insulating substrate that is formed of glass, quartz, ceramic, plastic, or the like.

A buffer layer 120 may be positioned between the substrate 110 and the drain electrode 175. The buffer layer 120 may cover the substrate 110. The buffer layer 120 may include an inorganic insulating material such as a silicon oxide (SiOx), a silicon nitride (SiNx), aluminum oxide ($Al_2O_3$), hafnium oxide ($HfO_3$), and/or yttrium oxide ($Y_2O_3$). The buffer layer 120 may be a single layer or a multilayer. For example, when the buffer layer 120 includes two layers, a lower layer thereof may include a silicon nitride (SiNx) and an upper layer thereof may include a silicon oxide (SiOx). The buffer layer 120 serves to flatten a surface while preventing, or reducing the likelihood of, undesirable materials such as impurities or moisture from permeating therethrough.

The drain electrode 175 is positioned on the buffer layer 120. The drain electrode 175 has a quadrangular shape in a plan view. The drain electrode 175 may receive a data signal from a data line 71. The drain electrode 175 may be made of a multilayer of a metal layer including at least one of copper (Cu), a copper alloy, aluminum (Al), and an aluminum alloy, and a metal layer including at least one of molybdenum (Mo) and a molybdenum alloy.

The first insulating member 141 may be provided with tilted (or inclined) side walls 141a and 141b, and may be positioned on the drain electrode 175. The first insulating member 141 may include an insulating material such as a silicon oxide (SiOx) and/or a silicon nitride (SiNx).

The source electrode 173 is positioned on the first insulating member 141 in the same pattern as the first insulating member 141. All regions of the source electrode 173 overlap the drain electrode 175. The source electrode 173 may be made of a multilayer of a metal layer including at least one of copper (Cu), a copper alloy, aluminum (Al), and an aluminum alloy, and a metal layer including at least one of molybdenum (Mo) and a molybdenum alloy.

The active member 130 is positioned along both side walls of the first insulating member 141, both side walls of the source electrode 173, and both side walls of the drain electrode 175. The active member 130 includes a first active member 131 positioned at one side wall 141a of the first insulating member 141, and a second active member 132 separated from the first active member 131 and positioned at the other side wall 141b of the first insulating member 141.

In some embodiments, each of the first active member 131 and the second active member 132 extends along one side wall 141a and the other side wall 141b of the first insulating member 141.

The first active member 131 includes a first channel region 31a adjacent to the drain electrode 175 and a second channel region 31b adjacent to the source electrode 173. The second active member 132 includes a third channel region 32a adjacent to the drain electrode 175 and a fourth channel region 32b adjacent to the source electrode 173. The first active member 131 has a first channel CH1 through which carriers move from the second channel region 31b to the first channel region 31a, and the second active member 132 has a second channel CH2 through which carriers move from the fourth channel region 32b to the third channel region 32a. Because the first channel CH1 and the second channel CH2 are not parallel to an upper surface 110a of the substrate 110, a size of the transistor may be minimized irrespective of lengths of the channels CH1 and CH2, thereby reducing a space therefor. Accordingly, it is possible to easily manufacture a high-resolution display device.

One side wall 141a of the first insulating member 141 includes a first side wall 41a adjacent to the drain electrode 175 and a second side wall 41b adjacent to the source electrode 173. The other wall 141b of the first insulating member 141 includes a third side wall 41c adjacent to the drain electrode 175 and a fourth side wall 41d adjacent to the source electrode 173.

Because a lower width d1 of the first side wall 41a is greater than an upper width d2 of the second side wall 41b, a width d1 of the first channel region 31a positioned at a lower portion of the first active member 131 extending along one side wall 141a of the first insulating member 141 is greater than a width d2 of the second channel region 31b positioned at an upper portion thereof. Because the width d1 of the first channel region 31a is substantially the same as the width d1 of the first side wall 41a and the width d2 of the second channel region 31b is substantially the same as the width d2 of the second side wall 41b, for better comprehension and ease of description, the width d1 of the first channel region 31a is indicated by the same reference numeral as the width d1 of the first side wall 41a and the width d2 of the second channel region 31b is indicated by the same reference numeral as the width d2 of the second side wall 41b.

Similarly, because a lower width d3 of the third side wall 41c is greater than an upper width d4 of the fourth side wall 41d, a width d3 of the third channel region 32a positioned at a lower portion of the second active member 132 extending along the other side wall 141b of the first insulating member 141 is greater than a width d4 of the fourth channel region 32b positioned at a lower portion thereof. For better comprehension and ease of description, the width d3 of the third channel region 32a is indicated by the same reference numeral as the width d3 of the third side wall 41c and the width d4 of the fourth channel region 32b is indicated by the same reference numeral as the width d4 of the fourth side wall 41d.

As such, by forming the width d1 of the first channel region 31a adjacent to the drain electrode 175 to be greater than the width d2 of the second channel region 31b adjacent to the source electrode 173 and by forming the width d3 of the third channel region 32a adjacent to the drain electrode 175 to be greater than the width d4 of the fourth channel region 32b adjacent to the source electrode 173, it is possible to prevent characteristics of the transistor from deteriorating due to a hot carrier effect, or to reduce the likelihood thereof.

A hot carrier as used herein refers to an electron or a hole which is accelerated by a strong electric field inside a transistor and has high kinetic energy. Because the hot carrier with the high kinetic energy is injected into or trapped in a charge region in which it should not be placed, characteristics of the transistor may be degraded, and therefore a phenomenon in which the transistor is degraded by the hot carrier is referred to herein as a hot carrier effect. In the present exemplary embodiment, by forming the widths d1 and d3 of the channel regions 31a and 32a adjacent to the drain electrode 175 to be greater than the widths d2 and d4 of the channel regions 31b and 32b adjacent to the source electrode 173, it is possible to minimize the hot carrier effect.

On the other hand, as a first tilt angle θ1 of one side wall 141a of the first insulating member 141 decreases, a length of the first channel CH1 formed inside the first active member 131 increases. In addition, as the first tilt angle θ1 of one side wall 141a of the first insulating member 141 decreases, the width d2 of the second channel region 31b adjacent to the source electrode 173 decreases. Similarly, as a second tilt angle θ2 of the other side wall 141b of the first insulating member 141 decreases, a length of the second channel CH2 formed inside the second active member 132 increases. In addition, as the second tilt angle θ2 of the other side wall 141b of the first insulating member 141 decreases, the width d4 of the fourth channel region 32b adjacent to the source electrode 173 decreases.

The first active member 131 and the second active member 132 may each include an oxide semiconductor material. The oxide semiconductor material may include oxides of metals such as zinc (Zn), indium (In), gallium (Ga), tin (Sn), and titanium (Ti), or metals such as zinc (Zn), indium (In), gallium (Ga), tin (Sn), and titanium (Ti), and a combination thereof. Specifically, the oxide may include at least one of zinc oxide (ZnO), zinc-tin oxide (ZTO), zinc-indium oxide (ZIO), indium oxide (InO), titanium oxide (TiO), indium-gallium-zinc oxide (IGZO), and/or indium-zinc-tin oxide (IZTO).

The second insulating member 142 is positioned on the source electrode 173 and the active member 130 to cover them. The second insulating member 142 may include an insulating material such as a silicon oxide (SiOx) or a silicon nitride (SiNx).

The gate electrode 151 overlapping the active member 130 is positioned on the second insulating member 142. The gate electrode 151 may receive a scan signal from a scan line 51.

When the scan signal is applied to the gate electrode 151, the source electrode 173 and the drain electrode 175 may be determined by a direction of a carrier flowing through the channels CH1 and CH2 of the active member 130, and the carrier flows from the source electrode 173 to the drain electrode 175. Accordingly, when an n-type transistor operates, an electron flows from the source electrode 173 to the drain electrode 175, and when a p-type transistor operates, a hole flows from the source electrode 173 to the drain electrode 175. In the present exemplary embodiment, because the transistor is the n-type transistor, a part connected to the data line 71 corresponds to the drain electrode 175.

Therefore, the drain electrode 175, the first active member 131, the second active member 132, the source electrode 173, and the gate electrode 151 form the transistor TR.

Figure 3:
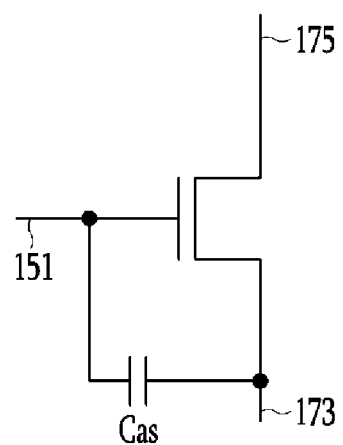
FIG. 3 illustrates an equivalent circuit diagram of the transistor of FIG. 1.

FIG. 3 illustrates an equivalent circuit diagram of the transistor TR of FIG. 1.

As shown in FIG. 2 and FIG. 3, the gate electrode 151 is overlapped with the source electrode 173 to form a capacitor Cas between the source electrode 173 and the gate electrode 151. Accordingly, a separate space for forming the capacitor is not required, thereby reducing a spatial limitation. Accordingly, it is possible to easily manufacture a high-resolution display device.

A manufacturing method of the transistor shown in FIG. 1 to FIG. 3 will now be described in detail with reference to FIG. 4 to FIG. 7.

Figure 4:
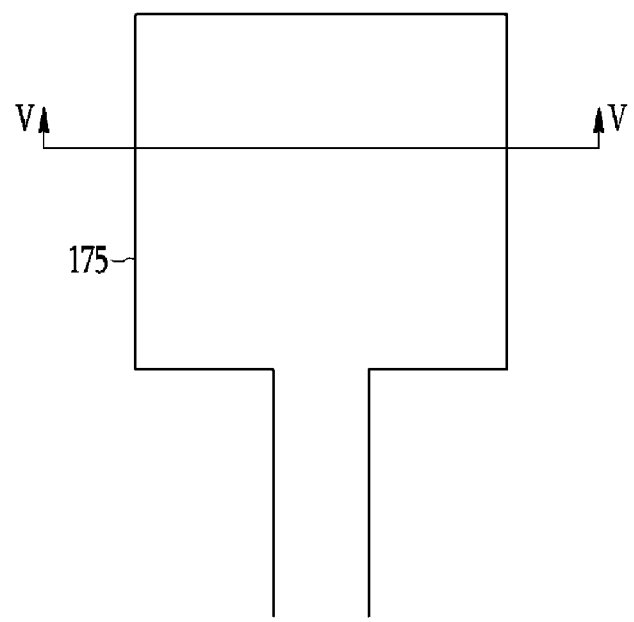
FIG. 4 illustrates a top plan view of a first process of a manufacturing method of a transistor according to an exemplary embodiment.
Figure 5:
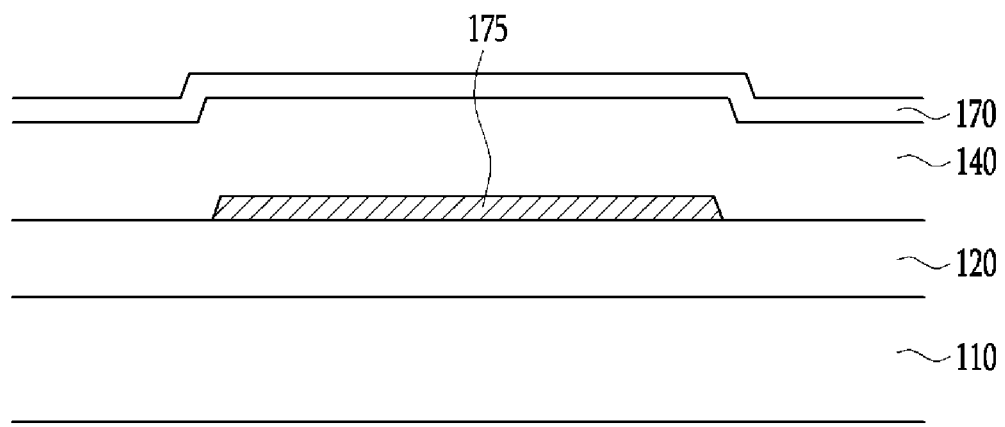
FIG. 5 illustrates a cross-sectional view taken along the line V-V of FIG. 4.
Figure 6:
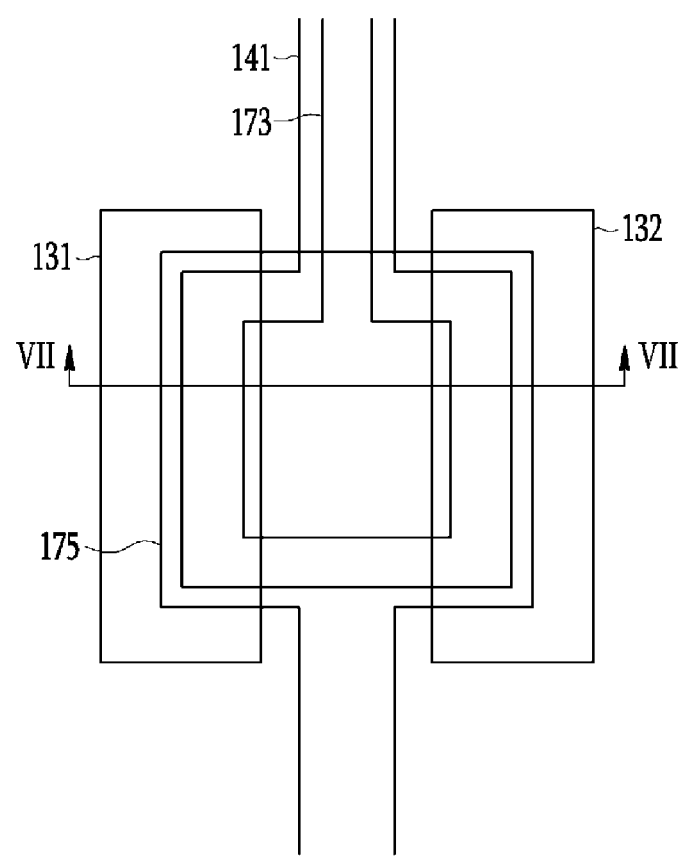
FIG. 6 illustrates a top plan view of a second process of the manufacturing method of a transistor according to an exemplary embodiment.
Figure 7:
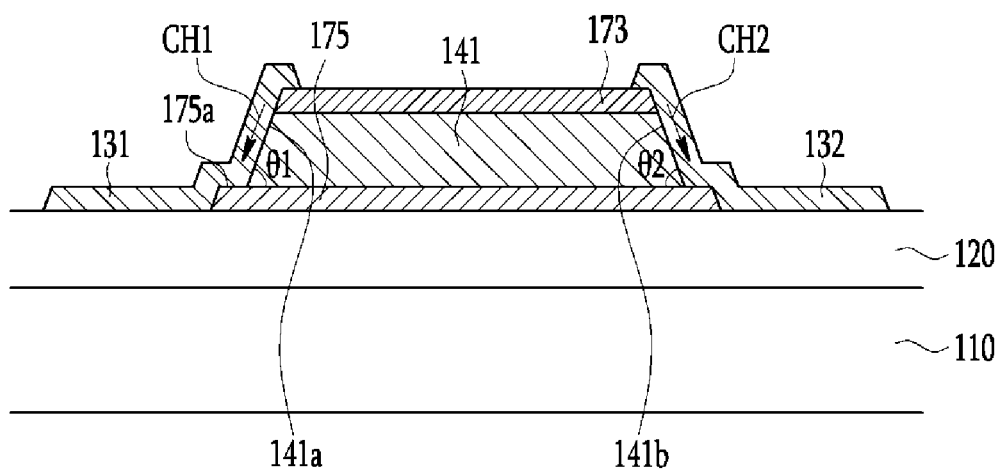
FIG. 7 illustrates a cross-sectional view taken along the line VII-VII of FIG. 6.

FIG. 4 illustrates a top plan view of a first process of a manufacturing method of a transistor according to an exemplary embodiment, FIG. 5 illustrates a cross-sectional view taken along the line V-V of FIG. 4, FIG. 6 illustrates a top plan view of a second process of a manufacturing method of the transistor according to an exemplary embodiment, and FIG. 7 illustrates a cross-sectional view taken along the line VII-VII of FIG. 6.

As shown in FIG. 4 and FIG. 5, an inorganic insulating material such as a silicon oxide (SiOx), a silicon nitride (SiNx), aluminum oxide (Al$_2$O$_3$), hafnium oxide (HfO$_3$), and/or yttrium oxide (Y$_2$O$_3$) is deposited on the substrate 110 through chemical vapor deposition (CVD) to form the buffer layer 120.

Next, a conductive material such as a metal is stacked on the buffer layer 120 through sputtering and patterned by using a first mask to form the drain electrode 175.

Then, an inorganic insulating material such as a silicon oxide (SiOx), a silicon nitride (SiNx), and/or a silicon oxynitride (SiON) is deposited through chemical vapor deposition to form a first insulating layer 140 covering the drain electrode 175. Then, a conductive material such as a metal is successively stacked on the first insulating layer 140 through sputtering to form a source electrode layer 170.

Next, as shown in FIG. 6 and FIG. 7, the first insulating layer 140 and the source electrode layer 170 are patterned by using a second mask to form the first insulating member 141 and the source electrode 173 provided with tilted side walls. For example, the first insulating layer 140 and the source electrode layer 170 may be simultaneously (or concurrently) etched by a wet or dry etching process or may be etched by two etching processes. As such, because the first insulating member 141 and the source electrode 173 are concurrently formed by using one second mask, it is possible to prevent an alignment error from occurring between the source electrode 173 and the first insulating member 141, or reduce the likelihood thereof, thereby minimizing or reducing a change of the length of the channel.

In addition, the first and second tilt angles θ1 and θ2 of the side wall of the first insulating member 141 may be adjusted by using a dry etching process and a photoresist (PR) consumption phenomenon. As the first tilt angle θ1 of one side wall 141a of the first insulating member 141 decreases, the length of the first channel CH1 formed inside the first active member 131 increases. In addition, as the first tilt angle θ1 of one side wall 141a of the first insulating member 141 decreases, the width d2 of the second channel region 31b adjacent to the source electrode 173 decreases. Similarly, as the second tilt angle θ2 of the other side wall 141b of the first insulating member 141 decreases, the length of the second channel CH2 formed inside the second active member 132 increases. In addition, as the second tilt angle θ2 of the other side wall 141b of the first insulating member 141 decreases, the width d4 of the fourth channel region 32b adjacent to the source electrode 173 decreases.

When the first insulating member 141 and the source electrode 173 are formed, at least a portion of an upper surface 175a of an end portion of the drain electrode 175 may be exposed. As the portion of the upper surface 175a of the end portion of the drain electrode 175 is exposed, the first active member 131 and the second active member 132 are positioned on the upper surface 175a of the end portion of the drain electrode 175. Accordingly, it is possible to extend the channel lengths in the first active member 131 and the second active member 132. In addition, by increasing adherence between the first and second active members 131 and 132 and the first insulating member 141, it is possible to further stably form the first active member 131 and the second active member 132.

Then, an oxide semiconductor material such as zinc oxide (ZnO), zinc-tin oxide (ZTO), zinc-indium oxide (ZIO), indium oxide (InO), titanium oxide (TiO), indium-gallium-zinc oxide (IGZO), and indium-zinc-tin oxide (IZTO) is stacked through chemical vapor deposition and patterned by using a third mask to form the first active member 131 and the second active member 132.

Next, as shown in FIG. 1 and FIG. 2, an inorganic insulating material such as a silicon oxide (SiOx), a silicon nitride (SiNx), and/or a silicon oxynitride (SiON) is stacked on the substrate 110 provided with the first active member 131 and the second active member 132 through chemical vapor deposition to form an insulating layer. Subsequently, the insulating layer is patterned by using a fourth mask to form the second insulating member 142. Then, a conductive material such as a metal is stacked on the second insulating member 142 through sputtering, for example, to form a gate electrode layer. The gate electrode layer is then patterned by using a fifth mask to form the gate electrode 151 overlapping the second insulating member 142.

In the exemplary embodiment described above, although all the regions of the source electrode overlap the drain electrode, only some of the regions of the source electrode may overlap the drain electrode in some exemplary embodiments.

Hereinafter, a transistor according to another exemplary embodiment of the present disclosure is described with reference to FIG. 8 and FIG. 9.

Figure 8:
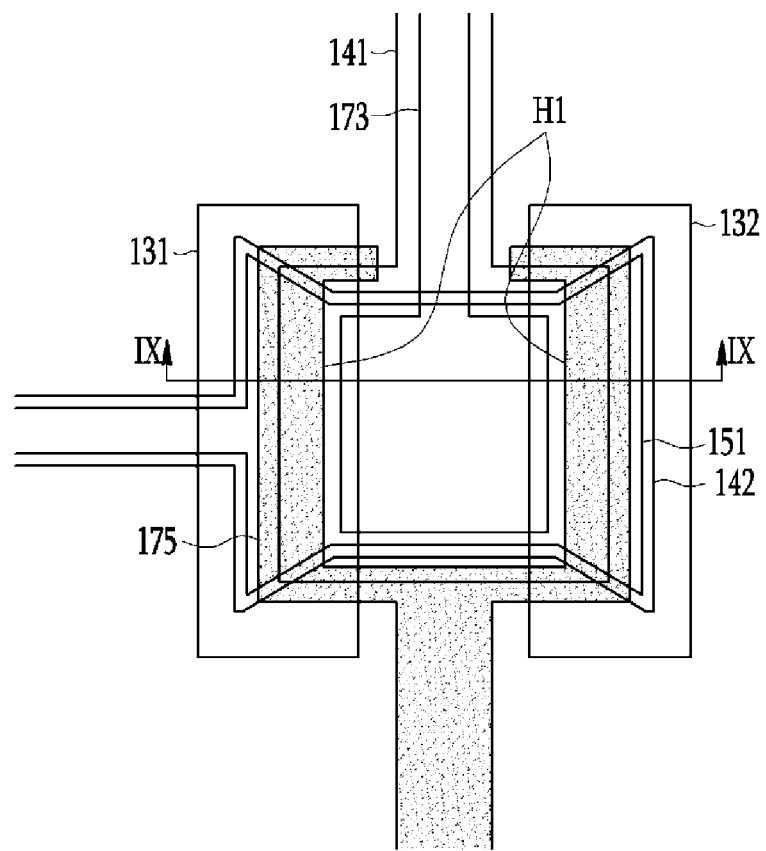
FIG. 8 illustrates a top plan view of a transistor according to another exemplary embodiment.
Figure 9:
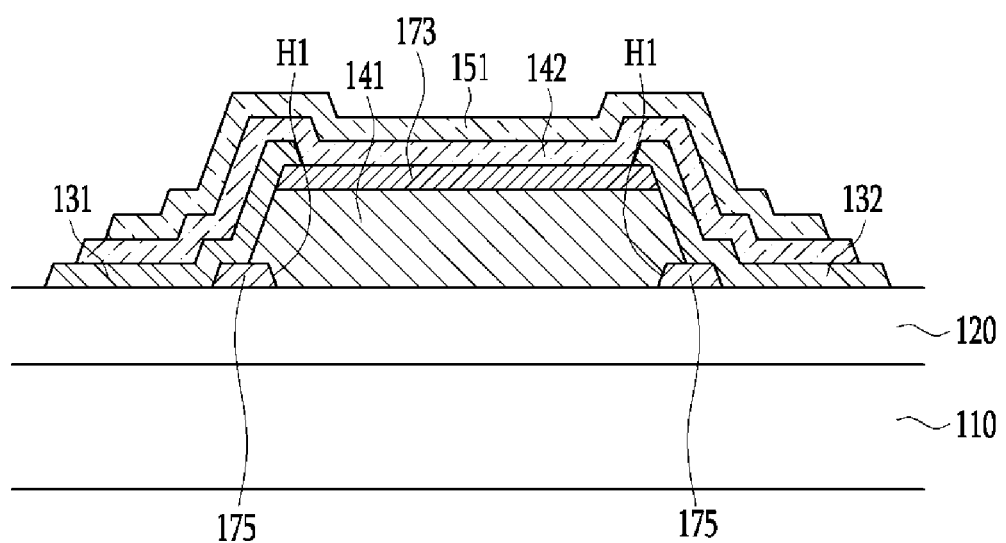
FIG. 9 illustrates a cross-sectional view taken along the line IX-IX of FIG. 8.

FIG. 8 illustrates a top plan view of a transistor according to another exemplary embodiment, and FIG. 9 illustrates a cross-sectional view taken along the line IX-IX of FIG. 8.

The exemplary embodiment shown in FIG. 8 and FIG. 9 is substantially the same as the exemplary embodiment shown in FIG. 1 to FIG. 3, except for a structure of a drain electrode, and thus a repeated description thereof may be omitted.

As shown in FIG. 8 and FIG. 9, the drain electrode 175 of the transistor according to the exemplary embodiment of the present disclosure is provided with a first opening H1, and the source electrode 173 positioned on the drain electrode 175 overlaps the first opening H1. Therefore, because only some regions of the source electrode 173 overlap the drain electrode 175, a parasitic capacitance generated by overlapping the source electrode 173 and the drain electrode 175 may be minimized or reduced.

In the exemplary embodiment, the gate electrode overlaps the source electrode to form the capacitor, but the gate electrode may not overlap the source electrode in some exemplary embodiments.

Hereinafter, a transistor according to another exemplary embodiment of the present disclosure will be described in detail with reference to FIG. 10 and FIG. 11.

Figure 10:
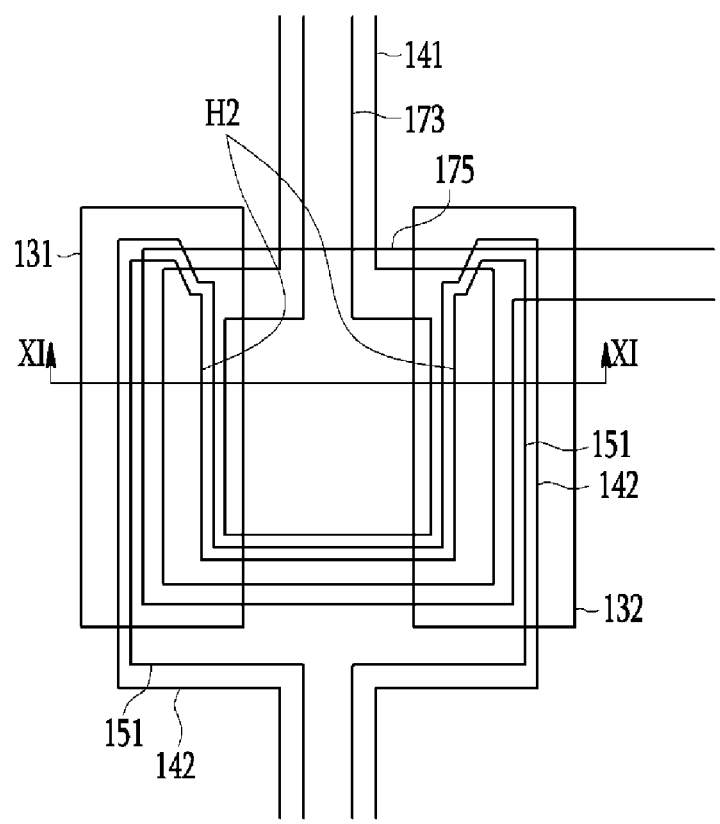
FIG. 10 illustrates a top plan view of a transistor according to another exemplary embodiment.
Figure 11:
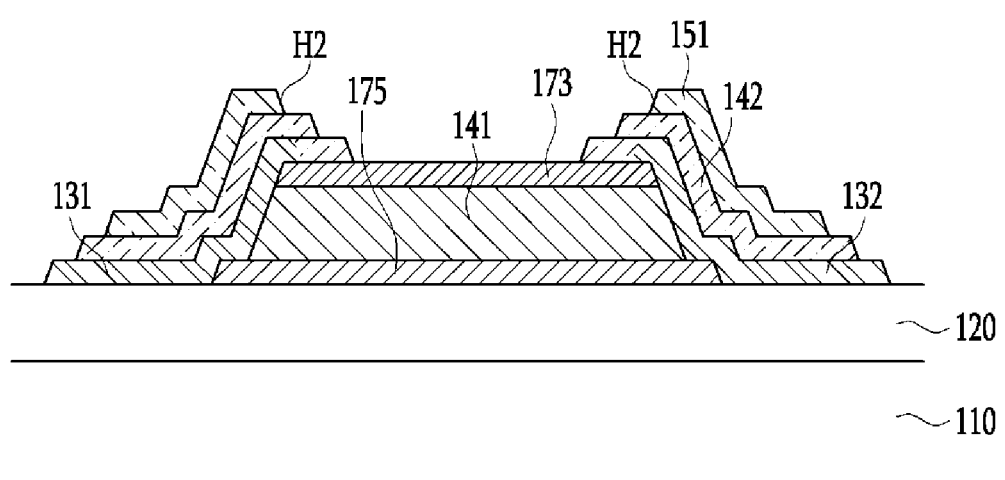
FIG. 11 illustrates a cross-sectional view taken along the line XI-XI of FIG. 10.

FIG. 10 illustrates a top plan view of a transistor according to another exemplary embodiment, and FIG. 11 illustrates a cross-sectional view taken along the line XI-XI of FIG. 10.

The exemplary embodiment shown in FIG. 10 and FIG. 11 is substantially the same as the exemplary embodiment shown in FIG. 1 to FIG. 3, except for structures of a second insulating member and a gate electrode, and thus a repeated description thereof may be omitted.

As shown in FIG. 10 and FIG. 11, the gate electrode 151 of the transistor according to the exemplary embodiment of the present disclosure is provided with a second opening H2, and the source electrode 173 overlaps the second opening H2. Accordingly, the capacitance between the gate electrode 151 and the source electrode 173 is minimized or reduced. For example, the second insulating member 142 may be formed with the same pattern as the gate electrode 151.

In the exemplary embodiment, although the first active member and the second active member that are separated from each other are formed, a third active member connecting the first active member and the second active member to each other may be included in some exemplary embodiments.

Hereinafter, a transistor according to another exemplary embodiment of the present disclosure is described with reference to FIG. 12 and FIG. 13.

Figure 12:
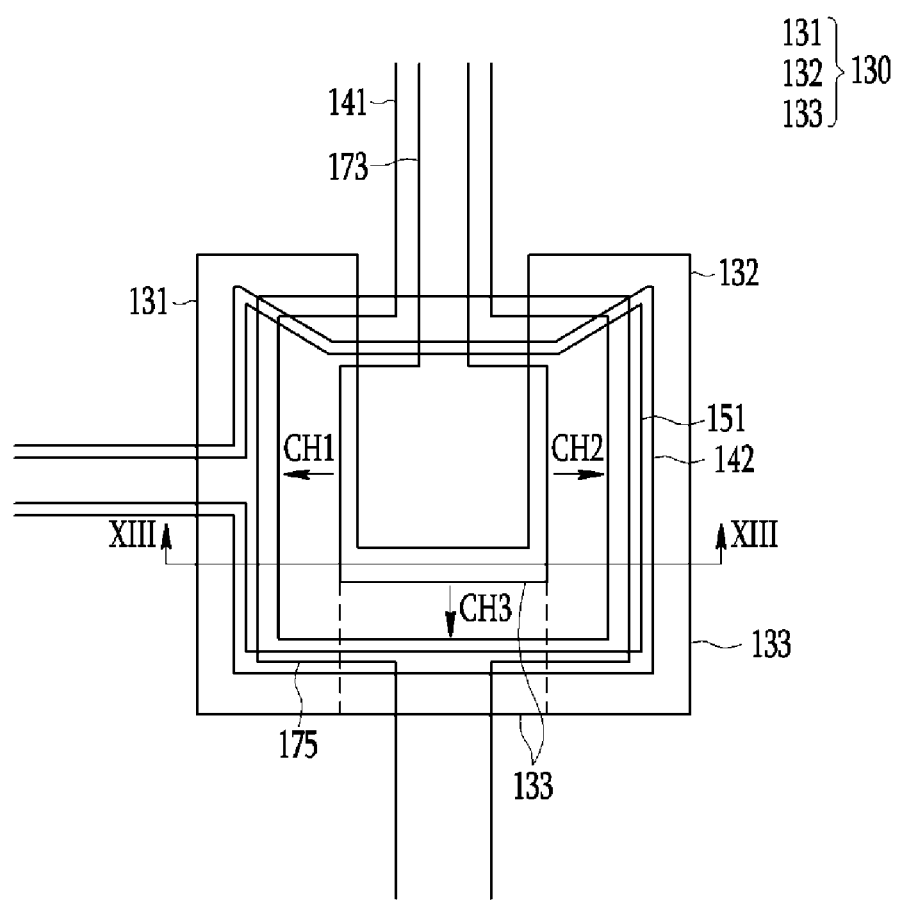
FIG. 12 illustrates a top plan view of a transistor according to another exemplary embodiment.
Figure 13:
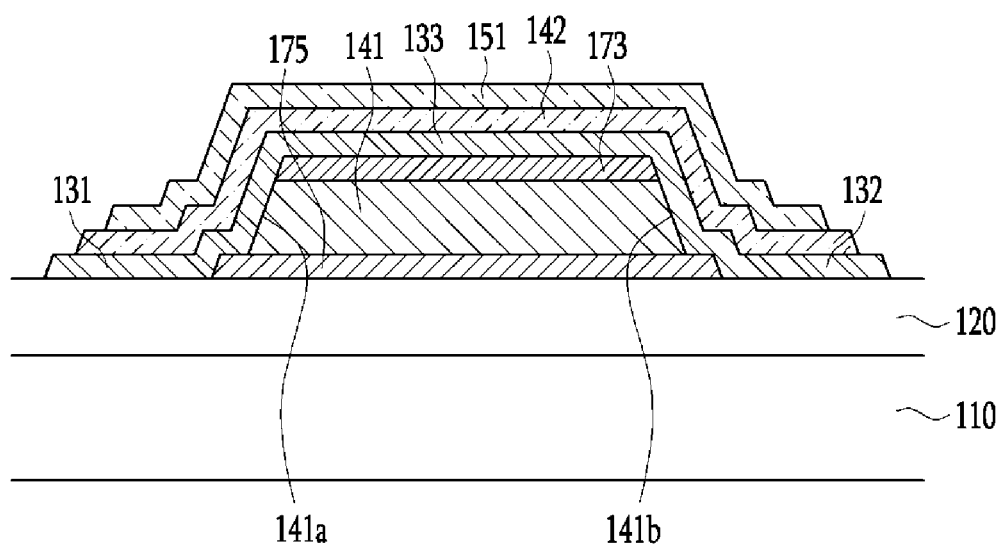
FIG. 13 illustrates a cross-sectional view taken along the line XIII-XIII of FIG. 12.

FIG. 12 illustrates a top plan view of a transistor according to another exemplary embodiment, and FIG. 13 illustrates a cross-sectional view taken along the line XIII-XIII of FIG. 12.

The exemplary embodiment shown in FIG. 12 and FIG. 13 is substantially the same as the exemplary embodiment shown in FIG. 1 to FIG. 3, except for a structure of an active member and a gate electrode, and thus a repeated description thereof may be omitted.

As shown in FIG. 12 and FIG. 13, in the transistor according the exemplary embodiment of the present disclosure, the active member 130 is positioned along three side walls of the first insulating member 141, three side walls of the source electrode 173, and three side walls of the drain electrode 175. The active member 130 includes the first active member 131 positioned at one side wall 141a of the first insulating member 141, the second active member 132 positioned at the other side wall 141b of the first insulating member 141 side wall, and a third active member 133 positioned at a middle side wall 141c of the first insulating member 141. The third active member 133 is positioned between the first active member 131 and the second active member 132.

The first active member 131 is provided with the first channel CH1, the second active member 132 is provided with the second channel CH2, and the third active member 133 is provided with a third channel CH3. As such, because the third channel CH3 in addition to the first channel CH1 and the second channel CH2 is formed in the same space, a high-resolution display device may be easily manufactured.

The second insulating member 142 is positioned on the source electrode 173 and the active member 130 to cover them. The gate electrode 151 overlapping the first active member 131, the second active member 132, and the third active member 133 is positioned on the second insulating member 142.

The gate electrode 151 overlaps the source electrode 173, thus a capacitor is formed between the source electrode 173 and the gate electrode 151. Accordingly, a separate space for forming the capacitor is not required, thereby reducing a spatial limitation. Accordingly, it is possible to easily manufacture a high-resolution display device.

In the exemplary embodiment, the gate electrode overlaps the source electrode to form the capacitor, but the gate electrode may not overlap the source electrode in some exemplary embodiments.

Hereinafter, a transistor according to another exemplary embodiment of the present disclosure is described with reference to FIG. 14 and FIG. 15.

Figure 14:
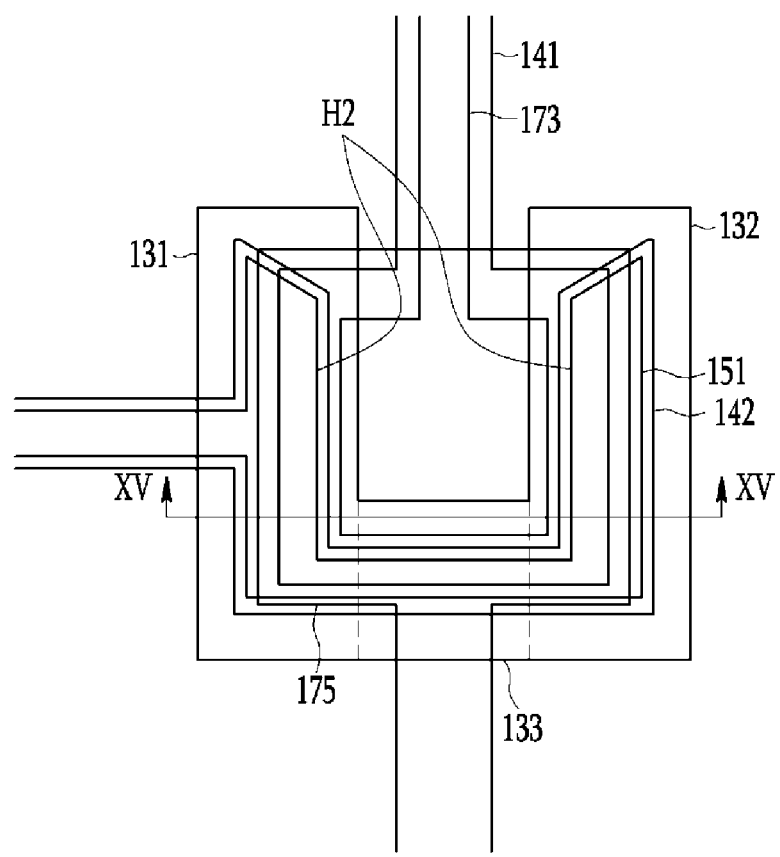
FIG. 14 illustrates a top plan view of a transistor according to another exemplary embodiment.
Figure 15:
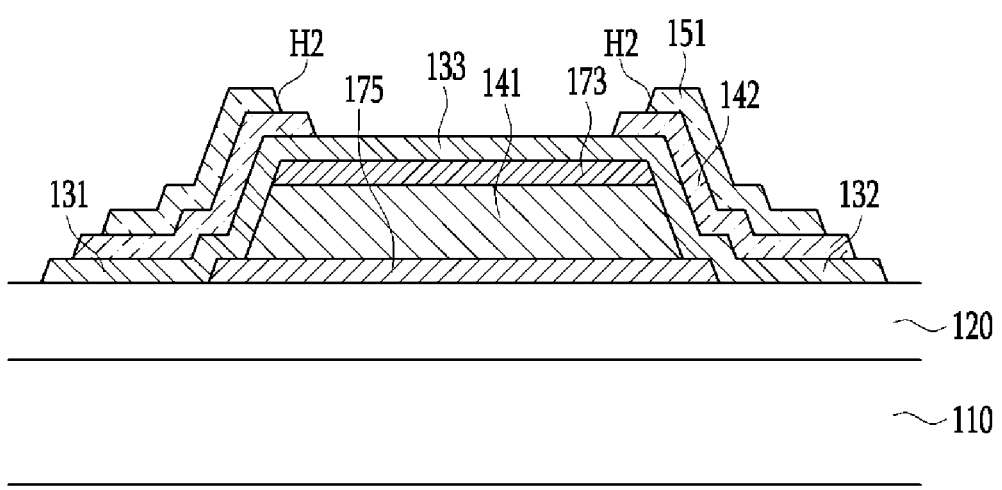
FIG. 15 illustrates a cross-sectional view taken along the line XV-XV of FIG. 14.

FIG. 14 illustrates a top plan view of a transistor according to another exemplary embodiment, and FIG. 15 illustrates a cross-sectional view taken along the line XV-XV of FIG. 14.

The exemplary embodiment shown in FIG. 14 and FIG. 15 is substantially the same as the exemplary embodiment shown in FIG. 12 and FIG. 13, except for structures of a second insulating member and a gate electrode, and thus a repeated description thereof may be omitted.

As shown in FIG. 14 and FIG. 15, the gate electrode 151 of the transistor according to the exemplary embodiment of the present disclosure is provided with a second opening H2, and the source electrode 173 overlaps the second opening H2. Accordingly, the capacitance between the gate electrode 151 and the source electrode 173 is minimized or reduced. The third active member 133 is positioned between the first active member 131 and the second active member 132. The second insulating member 142 may be formed in a pattern similar to that of the gate electrode 151.

In the exemplary embodiment, the first active member and the second active member facing each other are positioned at both side walls of the first insulating member, but the first active member may be positioned at only one side wall of the first insulating member in some exemplary embodiments.

Hereinafter, a transistor according to another exemplary embodiment of the present disclosure is described with reference to FIG. 16 and FIG. 17.

Figure 16:
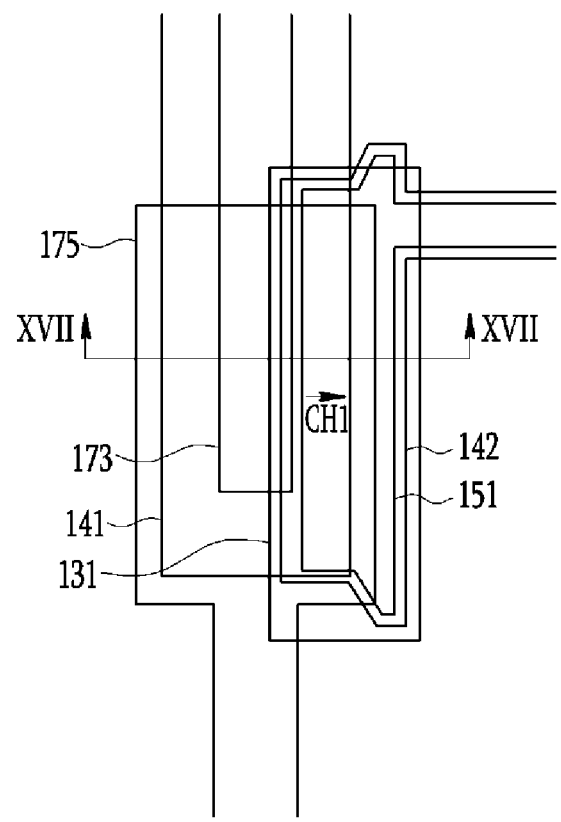
FIG. 16 illustrates a top plan view of a transistor according to another exemplary embodiment.
Figure 17:
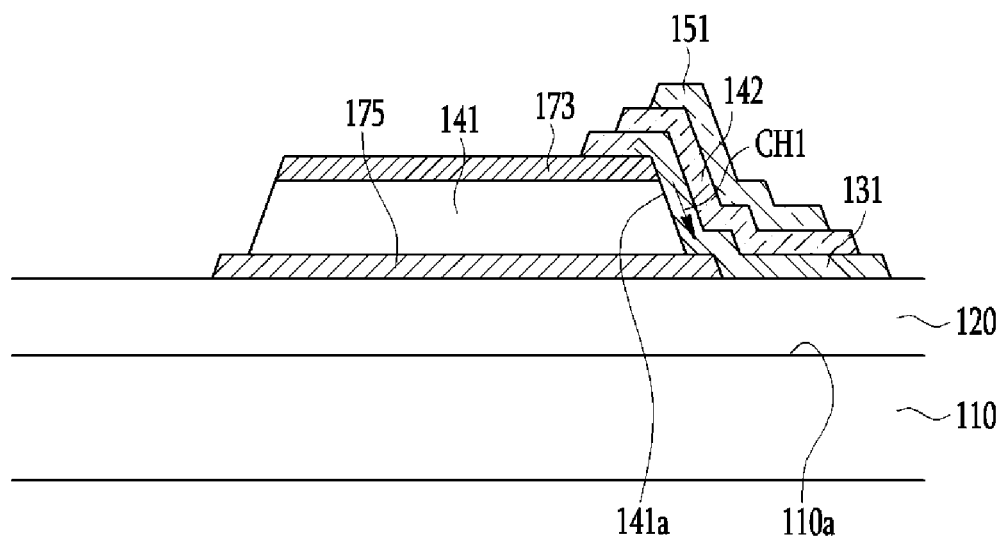
FIG. 17 illustrates a cross-sectional view taken along the line XVII-XVII of FIG. 16.

FIG. 16 illustrates a top plan view of a transistor according to another exemplary embodiment, and FIG. 17 illustrates a cross-sectional view taken along the line XVII-XVII of FIG. 16.

The exemplary embodiment shown in FIG. 16 and FIG. 17 is substantially the same as the exemplary embodiment shown in FIG. 1 to FIG. 3, except for a structure of an active member, and thus a repeated description thereof may be omitted.

As shown in FIG. 16 and FIG. 17, in the transistor according the exemplary embodiment of the present disclosure, the first active member 131 is positioned along one side wall 141a of the first insulating member 141.

The first channel CH1 is formed inside the first active member 131, and as the first channel CH1 is not parallel to the upper surface 110a of the substrate 110, a size of the transistor may be minimized or reduced, irrespective of a length of the first channel CH1, thereby reducing a spatial limitation. Accordingly, it is possible to easily manufacture a high-resolution display device.

Hereinafter, a display device including the transistor according to an exemplary embodiment is described.

Figure 18:
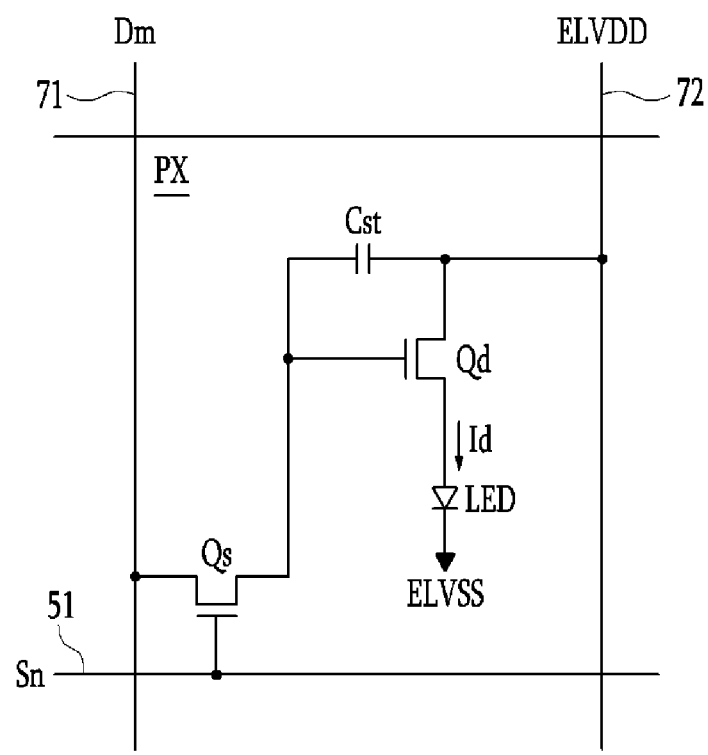
FIG. 18 illustrates an equivalent circuit diagram of a display device according to another exemplary embodiment.

FIG. 18 illustrates an equivalent circuit diagram of a display device according to an exemplary embodiment.

As shown in FIG. 18, a pixel PX of a display device according to an exemplary embodiment includes a plurality of signal lines 51, 71, and 72, a plurality of transistors Qd and Qs connected to the plurality of signal lines 51, 71, and 72, a storage capacitor Cst, and a light emitting diode LED.

The plurality of signal lines 51, 71, and 72 include the scan line 51 transmitting a scan signal Sn, the data line 71 transmitting a data signal Dm, and a driving voltage line 72 transmitting a driving voltage ELVDD.

The plurality of transistors Qd and Qs include a driving transistor Qd and a switching transistor Qs. The transistor shown in the present exemplary embodiment may be applied to the driving transistor Qd or the switching transistor Qs.

The switching transistor Qs includes a control terminal, an input terminal, and an output terminal, and the control terminal is connected to the scan line 51, the input terminal is connected to the data line 71, and the output terminal is connected to the driving transistor Qd. The switching transistor Qs responds to the scan signal Sn applied to the scan line 51 to transmit the data signal Dm applied to the data line 71 to the driving transistor Qd.

In addition, the driving transistor Qd includes a control terminal, an input terminal, and an output terminal, and the control terminal is connected to the switching transistor Qs, the input terminal is connected to the driving voltage line 72, and the output terminal is connected to the light emitting diode LED. The driving transistor Qd allows a driving current Id that is varied according to a voltage between the control terminal and the output terminal to pass therethrough.

The storage capacitor Cst is connected between the control terminal and the input terminal of the driving transistor Qd. The storage capacitor Cst is charged by a data signal applied to the control terminal of the driving transistor Qd, and maintains a charge even after the switching transistor Qs is turned off.

The light emitting diode LED includes an anode connected to the output terminal of the driving transistor Qd and a cathode connected to a common voltage ELVSS. The light emitting diode LED displays an image by emitting light with variable intensity according to the output current Id of the driving transistor Qd.

In the present exemplary embodiment, the switching transistor Qs and the driving transistor Qd are n-channel field effect transistors (FET), but embodiments of the present invention are not limited thereto, and the switching transistor Qs and the driving transistor Qd may be p-channel field effect transistors. The transistors Qs and Qd, the storage capacitor Cst, and the light emitting diode LED may be variously connected.

A structure of the display device shown in FIG. 18 is described in more detail with reference to FIG. 19. Additional description for the constituent elements described above may be omitted.

Figure 19:
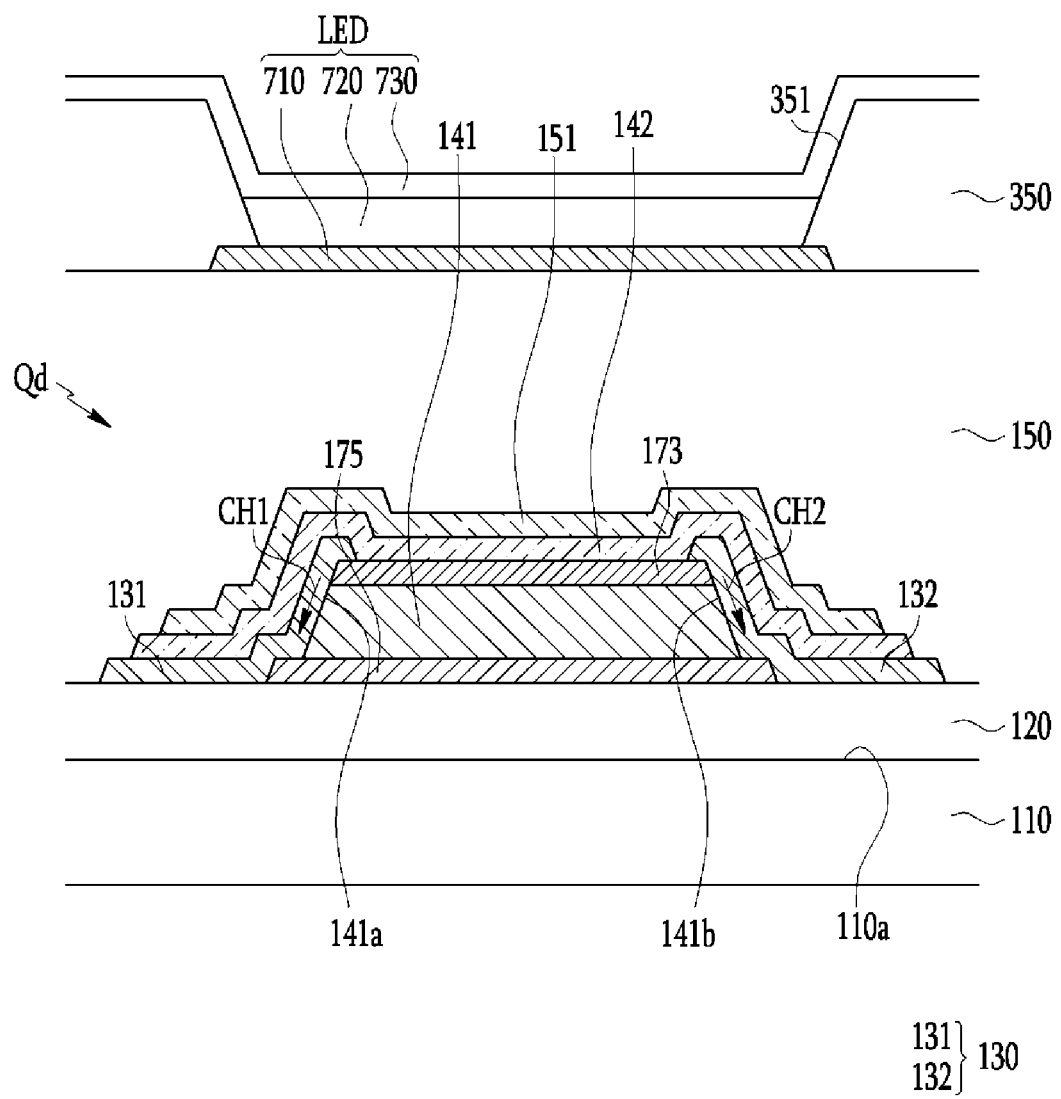
FIG. 19 illustrates a cross-sectional view of the display device of FIG. 18.

FIG. 19 illustrates a cross-sectional view of the display device of FIG. 18.

As shown in FIG. 19, in a display device according to an exemplary embodiment, the buffer layer 120 is positioned on the substrate 110, and the drain electrode 175 is positioned on the buffer layer 120. The first insulating member 141 provided with the tilted side walls 141a and 141b is positioned on the drain electrode 175. The source electrode 173 is positioned on the first insulating member 141 in a pattern similar to that of the first insulating member 141.

The active member 130 is positioned along both side walls of the first insulating member 141, both side walls of the source electrode 173, and both side walls of the drain electrode 175. The active member 130 includes the first active member 131 positioned at one side wall 141a of the first insulating member 141, and the second active member 132 separated from the first active member 131 and positioned at the other side wall 141b of the first insulating member 141.

The first active member 131 is provided with the first channel CH1, and the second active member 132 is provided with the second channel CH2. The second insulating member 142 is positioned on the source electrode 173 and the active member 130 to cover them. The gate electrode 151 overlapping the active member 130 is positioned on the second insulating member 142.

Accordingly, the drain electrode 175, the first active member 131, the second active member 132, the source electrode 173, and the gate electrode 151 may form the driving transistor Qd. The first active member 131 of the driving transistor Qd is provided with the first channel CH1, and the second active member 132 thereof is provided with the second channel CH2. Because the first channel CH1 and the second channel CH2 are not parallel to the upper surface 110a of the substrate 110, the size of the driving transistor Qd may be minimized or reduced, irrespective of the lengths of the channels CH1 and CH2, thereby easily manufacturing a high-resolution display device.

A passivation layer 150 is positioned on the driving transistor Qd to cover it. A pixel electrode 710 corresponding to a first electrode is positioned on the passivation layer 150, and the pixel electrode 710 may include a transparent conductive material such as indium tin oxide (ITO), indium zinc oxide (IZO), zinc oxide (ZnO), and/or indium oxide ($In_2O_3$), or a reflective metal material such as lithium (Li), calcium (Ca), lithium fluoride/calcium (LiF/Ca), lithium fluoride/aluminum (LiF/Al), aluminum (Al), silver (Ag), magnesium (Mg), and/or gold (Au). The pixel electrode 710 is electrically connected to the source electrode 173 of the driving transistor Qd to become an anode of the light emitting diode LED.

A pixel defining layer 350 is positioned on edge portions of the passivation layer 150 and the pixel electrode 710. The pixel defining layer 350 is provided with a pixel opening 351 overlapping the pixel electrode 710. The pixel defining layer 350 may include a resin such as polyacrylics and polyimides, and a silica-based inorganic material.

An emission member 720 is positioned at the pixel opening 351 of the pixel defining layer 350. The emission member 720 may include a plurality of layers including at least one of an emission layer, a hole injection layer (HIL), a hole transporting layer (HTL), an electron transporting layer (ETL), and an electron injection layer (EIL). The emission layer may be made of an organic material or an inorganic material. When the emission member 720 includes all of the layers, the hole injection layer may be positioned on the pixel electrode 710 corresponding to an anode, and the hole transporting layer, the emission layer, the electron transporting layer, and the electron injection layer may be sequentially stacked.

A common electrode 730 is positioned on the pixel defining layer 350 and the emission member 720. The common electrode 730 may include a transparent conductive material such as indium tin oxide (ITO), indium zinc oxide (IZO), zinc oxide (ZnO), and/or indium oxide ($In_2O_3$), or a reflective metal material such as lithium (Li), calcium (Ca), lithium fluoride/calcium (LiF/Ca), lithium fluoride/aluminum (LiF/Al), aluminum (Al), silver (Ag), magnesium (Mg), and/or gold (Au). The common electrode 730 becomes a cathode of the light emitting diode LED. The pixel electrode 710, the emission member 720, and the common electrode 730 form the light emitting diode LED.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

| Description of some symbols according to exemplary embodiments | |
|---|---|
| CH1: first channel | CH2: second channel |
| 110: substrate | 120: buffer layer |
| 131: first active member | 132: second active member |
| 133: third active member | 141: first insulating member |
| 142: second insulating member | 151: gate electrode |

What is claimed is:

1. A transistor comprising:
a drain electrode;
a first insulating member on the drain electrode and having a tilted side wall;
a source electrode on the first insulating member;
an active member covering the tilted side wall of the first insulating member, a side wall of the source electrode, and a side wall of the drain electrode;
a second insulating member covering the source electrode and the active member; and
a gate electrode on the second insulating member and overlapping the active member,
wherein the active member defines a first channel region adjacent to the drain electrode and a second channel region adjacent to the source electrode, and
wherein a width of the first channel region is greater than that of the second channel region.

2. The transistor of claim 1, wherein the tilted side wall of the first insulating member comprises a first side wall adjacent to the drain electrode and a second side wall adjacent to the source electrode, and
wherein a width of the first side wall is greater than that of the second side wall.

3. The transistor of claim 1, wherein all regions of the source electrode overlap the drain electrode.

4. The transistor of claim 1, wherein some regions of the source electrode overlap the drain electrode.

5. The transistor of claim 4, wherein the drain electrode has a first opening, and
wherein the source electrode overlaps the first opening.

6. The transistor of claim 1, wherein the active member comprises a first active member and a second active member that are separated from each other.

7. The transistor of claim 6, wherein the gate electrode has a second opening, and
wherein the source electrode overlaps the second opening.

8. The transistor of claim 6, wherein the active member comprises a third active member between the first active member and the second active member, and
wherein the gate electrode overlaps the third active member.

9. The transistor of claim 8, wherein the gate electrode overlaps the source electrode.

10. The transistor of claim 8, wherein the gate electrode has a second opening, and
wherein the source electrode overlaps the second opening.

11. A manufacturing method of a transistor, the method comprising:
forming a drain electrode on a substrate;

sequentially covering the drain electrode with a first insulating layer and a source electrode layer;
concurrently patterning the first insulating layer and the source electrode layer to form a first insulating member and a source electrode each having a tilted side wall;
covering the tilted side wall of the first insulating member, the tilted side wall of the source electrode, and a side wall of the drain electrode with an active member;
covering the source electrode and the active member with a second insulating member; and
forming a gate electrode overlapping the active member on the second insulating member,
wherein the active member defines a first channel region adjacent to the drain electrode and a second channel region adjacent to the source electrode, and
wherein a width of the first channel region is greater than that of the second channel region.

12. The manufacturing method of the transistor of claim 11, wherein the forming of the first insulating member and the source electrode comprises exposing at least a portion of an upper surface of the drain electrode.

13. A display device comprising:
a substrate;
a transistor on the substrate; and
a light emitting diode (LED) connected to the transistor, the transistor comprising:
a drain electrode on the substrate;
a first insulating member on the drain electrode and having a tilted side wall;
a source electrode on the first insulating member;
an active member covering the tilted side wall of the first insulating member, a side wall of the source electrode, and a side wall of the drain electrode;
a second insulating member covering the source electrode and the active member; and
a gate electrode on the second insulating member and overlapping the active member,
wherein the tilted side wall of the first insulating member comprises:
a first side wall adjacent to the drain electrode; and
a second side wall adjacent to the source electrode, and
wherein a width of the first side wall is greater than that of the second side wall, and
wherein the light emitting diode (LED) comprises:
a first electrode connected to the transistor;
an emission member on the first electrode; and
a second electrode on the emission member.

* * * * *